United States Patent
Kim et al.

(10) Patent No.: US 12,477,860 B2
(45) Date of Patent: Nov. 18, 2025

(54) SOLAR CELL AND SOLAR CELL MODULE COMPRISING SAME

(71) Applicant: KOREA UNIVERSITY RESEARCH AND BUSINESS FOUNDATION, Seoul (KR)

(72) Inventors: Donghwan Kim, Yangpyeong-gun (KR); Hae-Seok Lee, Seoul (KR); Yongseok Jun, Seoul (KR); Yoonmook Kang, Seoul (KR); Yujin Jung, Seoul (KR); Jongwon Ko, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 48 days.

(21) Appl. No.: 17/887,028

(22) Filed: Aug. 12, 2022

(65) Prior Publication Data

US 2022/0384664 A1 Dec. 1, 2022

Related U.S. Application Data

(63) Continuation of application No. PCT/KR2020/009376, filed on Jul. 16, 2020.

(30) Foreign Application Priority Data

Feb. 14, 2020 (KR) .......................... 10-2020-0018065

(51) Int. Cl.
*H10F 77/00* (2025.01)
*H10F 19/90* (2025.01)
(Continued)

(52) U.S. Cl.
CPC ............ *H10F 77/935* (2025.01); *H10F 19/90* (2025.01); *H10F 77/244* (2025.01); *H10F 77/42* (2025.01); *H10F 77/50* (2025.01)

(58) Field of Classification Search
CPC ........... H01L 31/02008; H01L 31/0203; H01L 31/022466; H01L 31/05;
(Continued)

(56) References Cited

U.S. PATENT DOCUMENTS 5,017,243 A * 5/1991 Otsubo ................. H10F 71/121
438/98
2008/0257403 A1* 10/2008 Edmonds .............. H01L 31/048
136/251
(Continued)

FOREIGN PATENT DOCUMENTS

JP 2000-68544 A 3/2000
JP 2007073745 A * 3/2007 ..... H01L 31/022425
(Continued)

OTHER PUBLICATIONS

JP-2007073745-A English machine translation (Year: 2007).*
(Continued)

*Primary Examiner* — Andrew J Golden
(74) *Attorney, Agent, or Firm* — NSIP Law

(57) ABSTRACT

Disclosed are a solar cell and a solar cell module comprising same, the solar cell comprising: a solar cell structure having one or more hollows passing therethrough in the height direction, and a plurality of light-concentrating parts disposed in each of the one or more hollows.

9 Claims, 18 Drawing Sheets

(51) Int. Cl.
*H10F 77/20* (2025.01)
*H10F 77/42* (2025.01)
*H10F 77/50* (2025.01)

(58) Field of Classification Search
CPC ....... H01L 31/048–049; H01L 31/0445–0475; H01L 31/054–055; H01L 31/0468; H01L 31/0504; H01L 31/0508; H02S 40/20–22; H10F 77/935; H10F 77/244; H10F 77/50; H10F 77/42; H10F 19/90
See application file for complete search history.

(56) References Cited

U.S. PATENT DOCUMENTS

| | | | |
|---|---|---|---|
| 2012/0273030 A1* | 11/2012 | Jee | H01L 31/0488 136/251 |
| 2013/0025658 A1* | 1/2013 | Bedell | H01L 31/0747 136/255 |
| 2014/0246089 A1* | 9/2014 | Lee | H01L 31/0465 438/69 |
| 2014/0345670 A1 | 11/2014 | Fornari | |
| 2015/0194555 A1 | 7/2015 | Zhang et al. | |
| 2018/0130918 A1* | 5/2018 | Chang | H01L 31/048 |
| 2019/0273171 A1 | 9/2019 | Bergstrom et al. | |
| 2019/0312163 A1* | 10/2019 | Lu | H01L 31/0504 |
| 2020/0279693 A1* | 9/2020 | Moon | H01G 9/2068 |

FOREIGN PATENT DOCUMENTS

| | | | |
|---|---|---|---|
| JP | 2016058696 A | * | 4/2016 |
| KR | 10-0648273 B1 | | 11/2006 |
| KR | 10-0765965 B1 | | 10/2007 |
| KR | 10-2012-0117085 A | | 10/2012 |
| KR | 2012113206 A | * | 10/2012 |
| KR | 2012117409 A | * | 10/2012 |
| KR | 10-2013-0018527 A | | 2/2013 |
| KR | 10-1267136 B1 | | 5/2013 |
| KR | 10-2013-0059170 A | | 6/2013 |
| KR | 10-1338642 B1 | | 12/2013 |
| KR | 10-1391943 B1 | | 5/2014 |
| KR | 10-1459069 B1 | | 11/2014 |
| KR | 10-2016-0116895 A | | 10/2016 |
| KR | 10-1669947 B1 | | 10/2016 |
| KR | 10-1680462 B1 | | 11/2016 |
| KR | 10-1859837 B1 | | 5/2018 |
| KR | 10-2019-0036875 | | 4/2019 |
| KR | 10-2019-0042405 A | | 4/2019 |
| KR | 10-1988345 B1 | | 6/2019 |
| WO | WO 2011/087281 A2 | | 7/2011 |
| WO | WO 2013/180298 A1 | | 12/2013 |
| WO | WO-2017192022 A1 * | | 11/2017 ............. B32B 17/10 |

OTHER PUBLICATIONS

KR-2012113206-A English machine translation (Year: 2012).*
KR-2012117409-A English machine trnaslation (Year: 2012).*
JP-2016058696-A English machine translation (Year: 2016).*
International Search Report issued on Nov. 12, 2020 in counterpart PCT/KR2020/009376 (3 pages in Korean, 3 pages in English).

* cited by examiner

Vertical arrangement

SOLAR CELL AND SOLAR CELL MODULE COMPRISING SAME

CROSS-REFERENCE TO RELATED APPLICATIONS

Pursuant to 35 USC 120 and 365(c), this application is a continuation of International Application No. PCT/KR2020/009376 filed on Jul. 16, 2020, and claims the benefit under 35 USC 119(a) of Korean Application No. 10-2020-0018065 filed on Feb. 14, 2020, in the Korean Intellectual Property Office, the entire disclosures of which are incorporated herein by reference for all purposes.

STATEMENT REGARDING GOVERNMENT SPONSORED RESEARCH OR DEVELOPMENT

The present invention relates to the energy technology development project of the Ministry of Trade, Industry and Energy (task identification number: 20193091010240, research management agency: Korea Energy Technology Evaluation and Planning Institute, research project name: transparent solar cell platform development that is easy to expand, organizer: Korea University Industry-Academic Cooperation Foundation, Research period: 2019 Sep. 1-2021 May 31, Contribution rate: ½).

In addition, the present invention is a personal basic research (Ministry of Science and Technology) (R&D) (Project Unique Number: 1711114168, Research Management Agency: National Research Foundation of Korea, Research Project Title: Nanostructure thin film development and It was derived from research conducted as part of the PID-free Perovskite development to which this was applied, the host institution: Korea University Industry-University Cooperation Foundation, research period: 2022 Mar. 1-2023 Feb. 28, contribution rate: ½).

There is no property interest of the Korean government in any aspect of this invention.

TECHNICAL FIELD

The present disclosure relates to a solar cell, and a solar cell module including the same.

BACKGROUND ART

In general, a solar system is a system that converts light energy into electric energy by using solar cells, and is used as an independent power source for general homes or the industries or is used as an auxiliary power source in association with systems of normal AC power sources.

The solar system is a semiconductor device that converts light energy to electric energy by using a photovoltaic effect.

A principle of a general solar cell requires a p-n junction diode, and a basic requirement for a solar cell for conversion of photovoltaic energy requires asymmetric presence of electrons in a semiconductor structure.

For crystalline silicon, generally, an n type material is deposited in a diffusion scheme when a P type silicon substrate is used as a base, and a p-n junction is made by depositing a p type material when an n type silicon substrate is used as a base.

Even in a thin film type solar cell, a p-n junction is formed by depositing films of p and n types on a substrate.

Meanwhile, two semiconductor thin films having plus (+) and minus (−) polarities are provided, a plurality of solar cells are connected in series/parallel to each other to generate a voltage and a current required by a user, and the user uses electric power generated by the solar cells.

A grid-connected solar system used for a generally used building mounted type includes a plurality of solar cell arrays that convert solar energy into electric energy, and an inverter that converts DC power corresponding to electric energy obtained through conversion in the solar cell arrays to AC power and supplies the AC power to a used place.

In the solar system, installation of the solar cell arrays installed to obtain energy of the sunlight is the most important element in a configuration of the system, and the solar cell arrays are installed at a separately secured place or are installed on the roof of a building.

Accordingly, a separate space has to be secured to install the solar system in a building, but a cooling tower that constitutes a cooling device is generally installed on the roof of the building, and thus a place for installing the solar cell arrays is narrow and limited whereby the installation of the solar cell arrays is restricted and the installation operation is difficult.

There is a case, in which a solar system is applied to a window system installed for lighting and ventilation of a building to supplement the disadvantage.

That is, Korean Patent No. 10-0765965 discloses a window using solar cells.

A conventional window using solar cells will be described with reference to FIG. 1.

FIG. 1 is a perspective view of a conventional window.

Referring to FIG. 1, a conventional window 10 includes a solar cell array 11 that converts solar energy into electric energy, and a frame 11a coupled to a periphery of the solar cell array 11 and mounted in an opening 13 of a wall body 12 of the building.

That is, the conventional window 10 has a structure, in which the solar cell array 11 is fixed to an inner central portion of the frame 11a having a rectangular shape, and an outer glass window located on an outer side of the wall body 12 of the building and an inner glass window located on an inner side thereof are disposed on a front side and a rear side of the solar cell array 11 to be spaced apart from the solar cell array 11 by a specific distance and are fixed.

Meanwhile, a device such as a blind or a vertical may be separately installed for privacy when most of the windows are installed, and costs therefor are not low.

In this way, conventionally, the windows and the blinds are separately provided and thus costs or spaces are not efficient.

In recent years, methods for directly installing the blinds to the glass of the building for installation have been suggested.

That is, as illustrated in FIG. 2, it is manufactured by disposing a plurality of solar cells 21 including crystalline or multi-crystalline between reinforced glass boards 22a and 22b, and attaching them by using EVS films 23.

Generally, a front surface of a conventional solar cell module 20 manufactured in this way has a blue color or a black color as illustrated in FIG. 3A, and a rear surface thereof mostly has a gray color as illustrated in FIG. 3B.

In the conventional solar cell module 20, two electrode lines of a width of 3 mm to 5 mm are formed of silver paste Ag through screen printing to form an electrode line 23b on a rear surface of the solar cell 21 and are dried in a roll conveyor employing an infrared (IR) lamp. The color of the electrode line 23b dried in this way is close to a bright gray color.

The solar cells 210 are manufactured by depositing an N-type layer on a P-type wafer or a P-type layer to an N-type wafer. When a P-type is used, rear surfaces of the solar cells 210 have a plus (+) polarity and front surfaces thereof have a minus (−) polarity.

When the solar cell module 20 is manufactured by using the solar cells 21, the solar cells 21 are connected to each other in series or in parallel.

Then, an interconnector ribbon 24 is used to connect the solar cells 21, a material of the interconnector ribbon 24 generally includes Sn+Pb+Ag, Sn+Ag, and Sn+Ag+Cu, and in the case of series connections, a silver paste electrode line 23a of a minus (−) polarity of a width of 1 mm to 3 mm, which is formed on the front surface of a solar cell 21, is connected to a silver paste electrode line 23b of a plus (+) polarity of a width of 3 mm to 5 mm, which is formed on the rear surface of another solar cell through the interconnector ribbon 24.

Meanwhile, when the solar cells are manufactured, the polarities of the front and rear surfaces thereof may be changed according to the kind of the base substrate.

In this way, the interconnector ribbon 24 that connects the solar cells 21 has a width of 1.5 mm to 3 mm and a thickness of 0.01 to 0.2 mm.

The connection methods include an indirect connection method by an IR lamp, a halogen lamp, and hot air and a direct connection method by an iron.

Meanwhile, the EVA film 23 located between glass substrates 22a and 22b of the solar cell module 20 starts to be melted at a temperature of 80° C. and becomes clear and transparent at a temperature of about 150° C., joins the solar cells 21 and the glass substrates, and prevents corrosion or a short-circuit of the silver electrode lines 23a and 23b and the ribbons 24 of the solar cells 21 by preventing external moisture and air that face the solar cells 21 from penetrating.

The EVA film 23 is melt between the dually jointed glass boards 22a and 22b of the solar cell module 20 to be viewed clearly and transparently when being laminated by a laminator (not illustrated), and then, the remaining portions, except for the solar cells 21 and the interconnector ribbons 24, are viewed clearly.

The conventional solar cell module 20 for BIPV is manufactured by using crystalline or multi-crystalline solar cells 21, and is disposed between the dual glass boards 22a and 22b of the building to be viewed from an inside and an outside of the building as it is.

In this way, a front surface of the solar cell module 20 mounted on a building has a color in a process of forming electrodes through PECVD and APCVD (not illustrated) corresponding to vacuuming equipment and depositing a reflection preventing film through screen printing. Generally, the front surface has a blue color or a black color, but a back-surface field (BSF) of the solar cell module 20 is deposited with aluminum (Al) by vacuuming equipment (not illustrated) to form electrodes, and thus the color becomes a gray color.

Furthermore, in the conventional solar cell module 20, several or several tens of solar cells 21 are connected by the interconnector ribbons 24 in the interiors of the glass boards 22a and 22b, and the interconnector ribbons 24 are not maintained straight constantly and are deflected and curved.

In this state, when the solar cell module 20 is finished through lamination, the shapes of the interconnector ribbons 24 that connect the solar cells 21 in the glass boards 22a and 22b are deflected and uneven as a whole.

Furthermore, the color of the interconnector ribbons 24 of the conventional solar cell module 20 is silver, and when the solar cell module 20 for BIPV is manufactured, the interconnector ribbons 24 have the original color and the front and rear surfaces thereof are exposed in silver.

Accordingly, in the conventional solar cell module 20, the rear surface thereof and the interconnector ribbons 24 have a gray color and a silver color, and because the silver color of the interconnector ribbons 24 is exposed to an outside through the front glass boards 22a and 22b on a front surface of the solar cell module 20, the gray and silver colors of the rear surface is viewed as it is, and the lines of the interconnector ribbons 24 are deflected and curved when the dually joined solar cell module 20 is manufactured, an aesthetic aspect thereof is not good when the solar cell module 20 is attached instead of glass of city buildings.

PRIOR TECHNICAL DOCUMENTS

Patent Documents

[Patent document 001] Korean Patent Application Publication No. 2012-0117085 (Oct. 24, 2012)
[Patent document 002] Korean Patent Application Publication No. 2013-0059170 (Jun. 5, 2013)

DETAILED DESCRIPTION OF THE INVENTION

Technical Problem

An aspect of the present disclosure provides a solar cell module that may be installed at any place because the sight is not hindered by manufacturing solar cells of a high efficiency, a safety of which is secured, in various shapes of micrometer sizes for modulation and increasing transmittance, and may enhance an amount of electric power by increasing an incident angle of the sunlight, and a solar cell module including the same.

The technical problems that are to be solved by the present disclosure are not limited to the above-mentioned ones, and the other technical problems that have not been mentioned will be clearly understood from the following description by an ordinary person in the art, to which the present disclosure pertains.

Technical Solution

According to an aspect of the present disclosure, a solar cell module includes a solar cell structure having at least one hollow that passes through the solar cell structure in a height direction thereof, and a plurality of light-concentrating parts disposed in each of the at least one hollow.

The light-concentrating part may include a luminescent solar concentrator (LSC).

The solar cell structure may include an inner surface facing the hollow and an outer surface on an opposite side to the inner surface, and a cross-section of the outer surface, which is perpendicular to the height direction, may have a polygonal shape.

A cross-section of the inner surface of the solar cell structure, which is perpendicular to the height direction, may have a polygonal shape.

In the solar cell structure, the numbers of sides of the polygonal shapes formed by the inner surface and the outer surface may be the same.

In the solar cell structure, the numbers of sides of the polygonal shapes formed by the inner surface and the outer surface may be different.

A cross-section of the inner surface of the solar cell structure, which is perpendicular to the height direction, may have a circular or elliptical shape.

The solar cell module may further include a transparent substrate, the solar cell may be disposed within one side of the transparent substrate, and the solar cell may be disposed perpendicularly to one side surface of the transparent substrate.

The solar cell module may further include a glass layer disposed on an opposite side surface of the transparent substrate.

Advantageous Effects of the Invention

According to the embodiments of the present disclosure, because a transparency may be increased so that a sight is not hampered by manufacturing solar cell of a high efficiency and having secured stability in various shapes of micrometer sizes and making them in a module, the solar cell module may be installed in any place and an incident angle of the sunlight may be increased whereby an amount of generated electric power may be enhanced.

The advantageous effects of the present disclosure are not limited to the above-mentioned ones, and the other advantageous effects will be clearly understood by an ordinary person skilled in the art to which the present disclosure pertains.

BEST MODE

Figure 1:
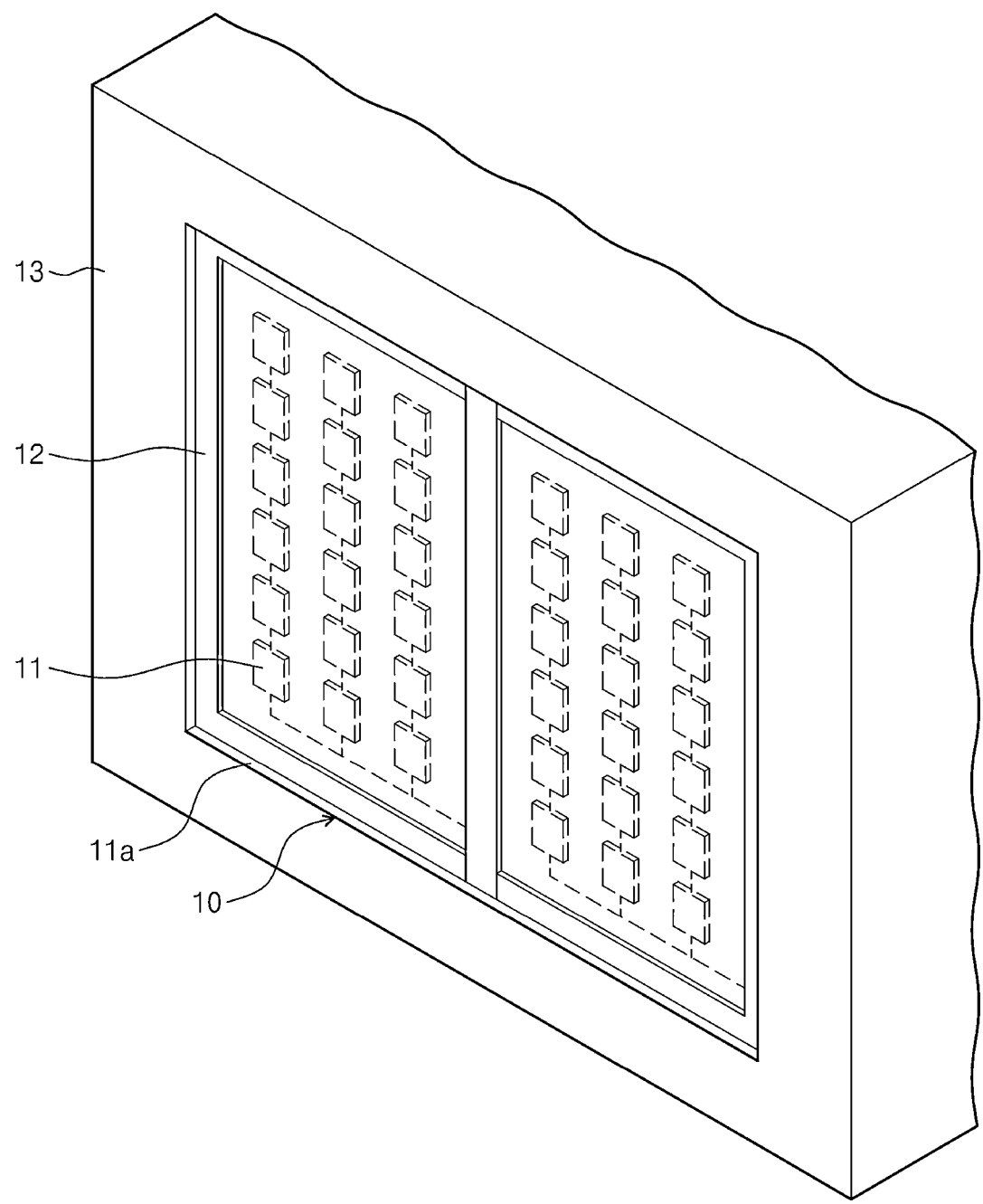
FIG. 1 is a perspective view of a conventional window.
Figure 2:
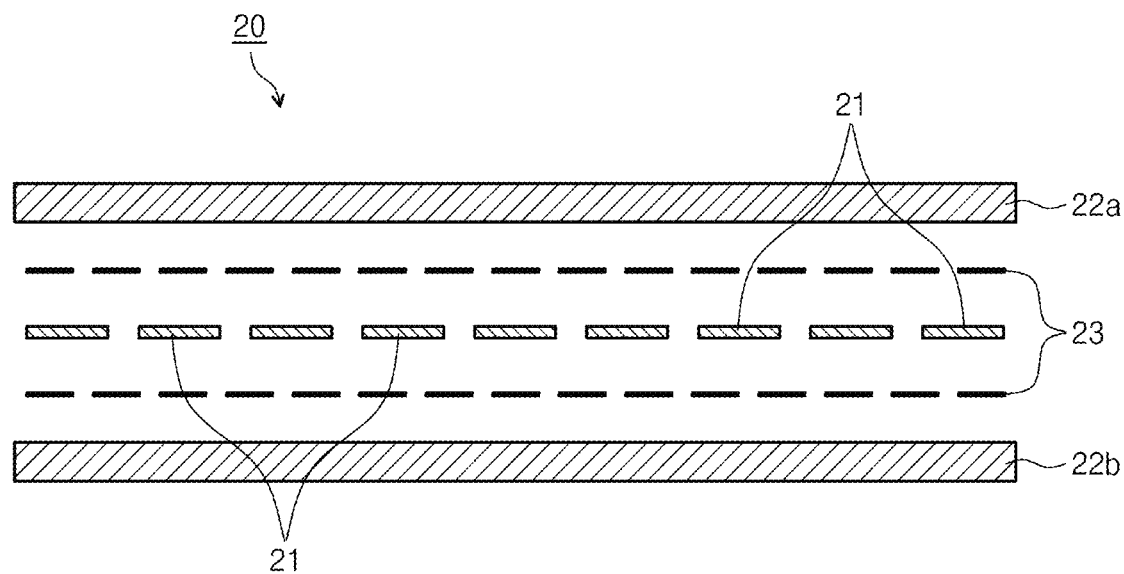
FIG. 2 is a cross-sectional view illustrating a conventional solar cell module.
Figure 3A:
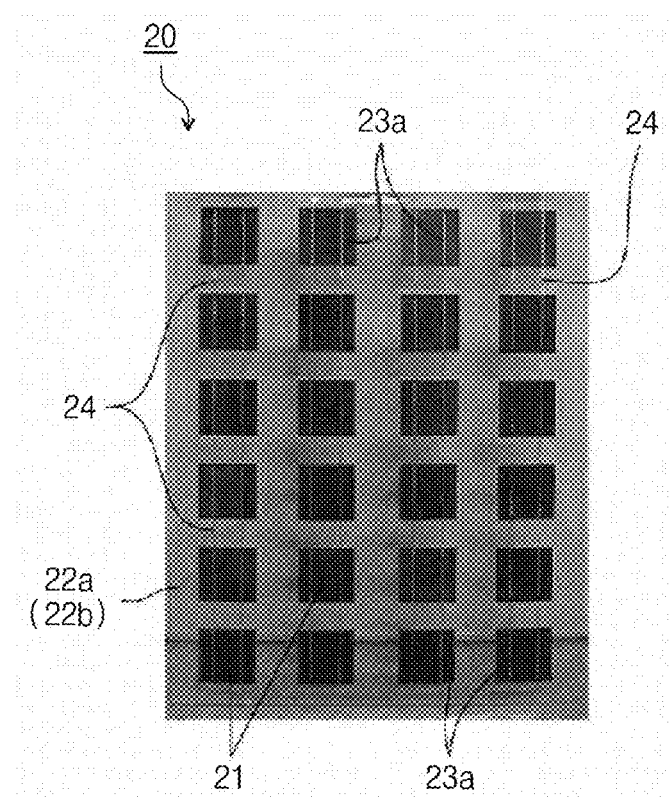
FIG. 3A is a front view illustrating a conventional solar cell module.
Figure 3B:
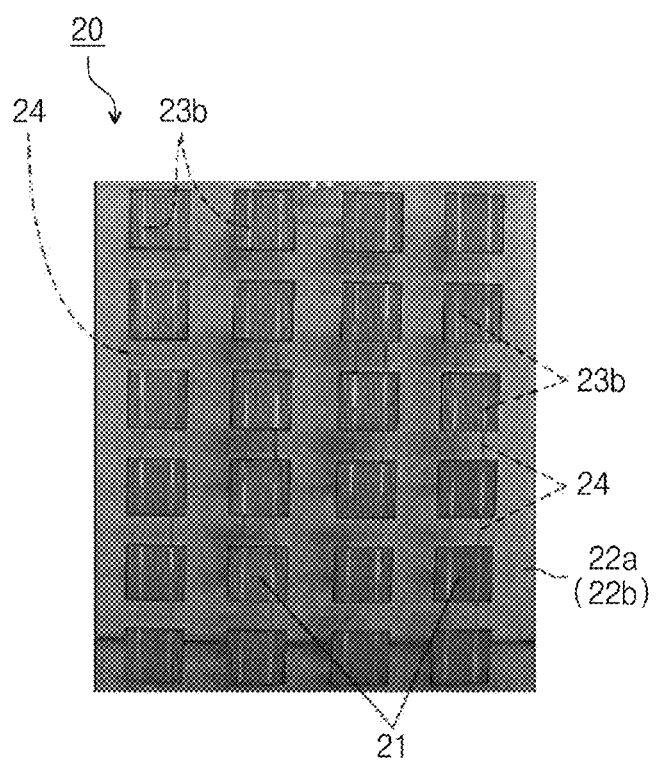
FIG. 3B is a rear view illustrating a conventional solar cell module.

Hereinafter, embodiments of the present disclosure will be described in detail with reference to the accompanying drawings. The embodiments of the present disclosure may be modified in various forms, and the scope of the present disclosure should not be construed to be limited to the following embodiments. The embodiments of the present disclosure are provided to describe the present invention for those skilled in the art more completely. Accordingly, the shapes of the components of the drawings are exaggerated to emphasize clearer description thereof.

The configurations of the present disclosure for clearly describing a solution for the problem that is to be solved by the present disclosure will be described in detail with reference to the accompanying drawings based on a preferred embodiment of the present disclosure, in which the same reference numerals are given for the same elements in denoting the reference numerals for the elements even though they are present in different drawings, and when a drawing has to be referenced for a description of the embodiment, the elements in another drawing also may be cited.

Figure 4:
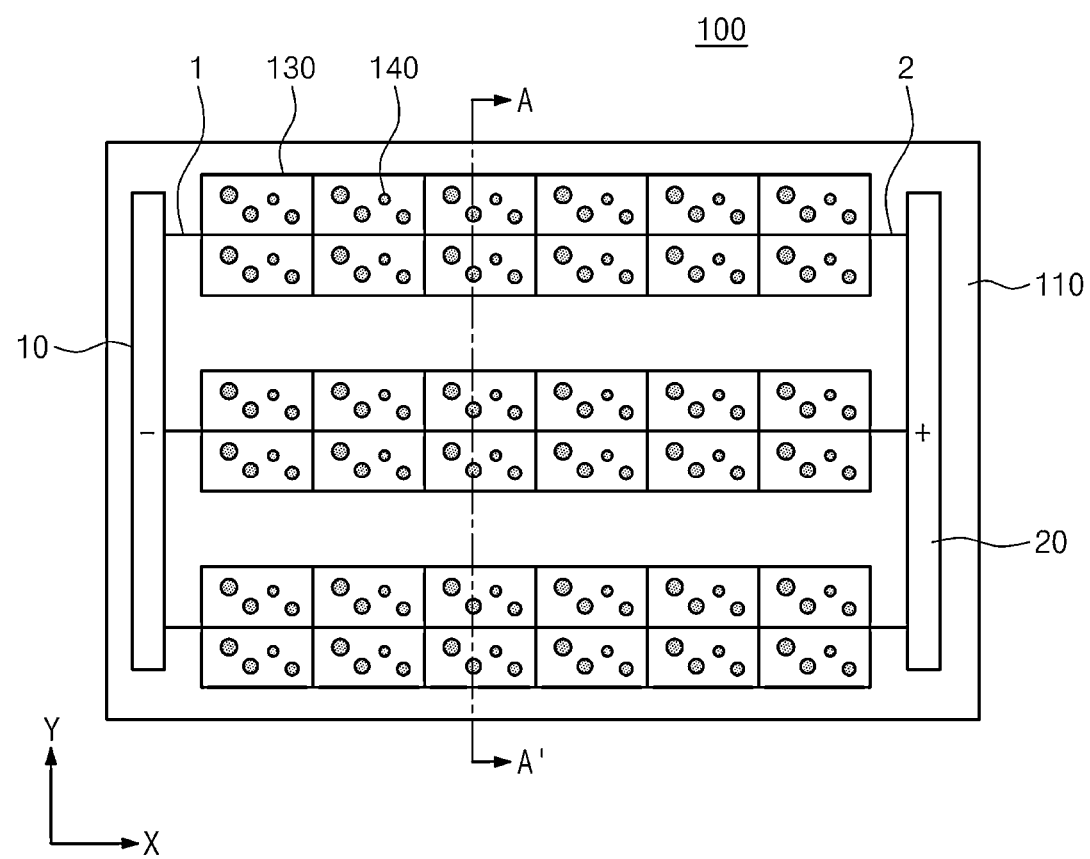
FIG. 4 is a diagram illustrating a solar cell module according to a first embodiment of the present disclosure.
Figure 5:
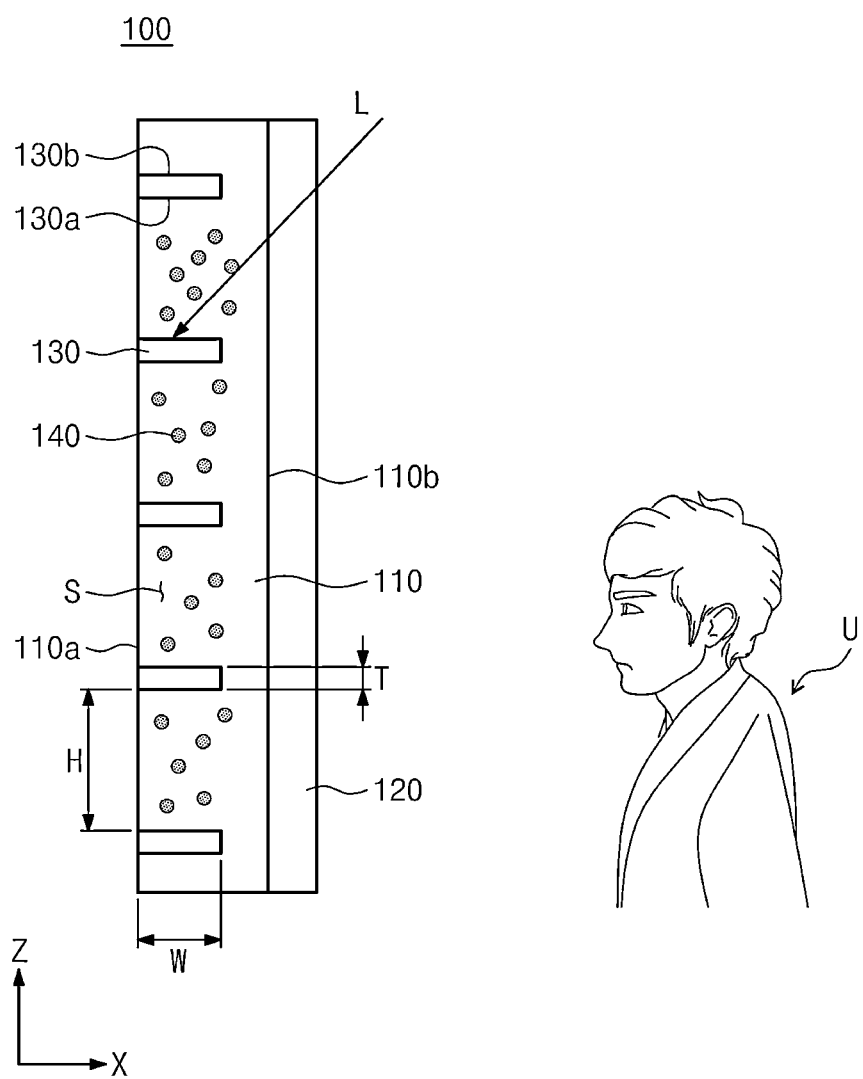
FIG. 5 is a diagram illustrating a cross-section of line A-A' of FIG. 4.
Figure 6:
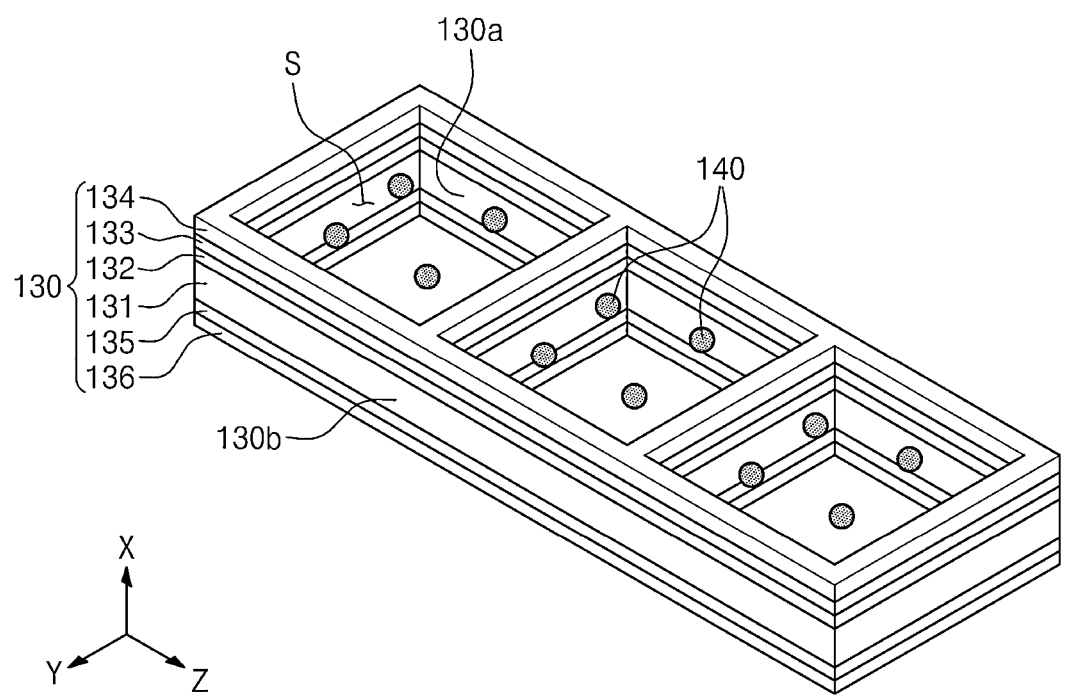
FIG. 6 is a diagram illustrating solar cells of FIG. 4.

FIG. 4 is a diagram illustrating a solar cell module according to a first embodiment of the present disclosure. FIG. 5 is a diagram illustrating a cross-section of line A-A' of FIG. 4. FIG. 6 is a diagram illustrating solar cells of FIG. 4.

Referring to FIGS. 4 to 6, a solar cell module 100 according to the first embodiment of the present disclosure may include conductive members 1 and 2, a first terminal 10, a second terminal 20, a transparent substrate 110, a glass layer 120, solar cells 130, and light-concentrating parts 140.

The transparent substrate 110 may have a thin film shape that has a length in a height direction (the Z axis direction), and may be formed of a light-transmitting material.

Here, the transparent substrate 110 includes one side surface 110a, and an opposite side surface 110b that is an opposite surface to the one side surface 110a, in a widthwise direction (the X axis direction).

The glass layer 120 may be joined to the opposite side surface 110b of the transparent substrate 110 to face a user "U". The glass layer 120 not only may be applied as a window while showing transparent characteristics but also may enhance an efficiency of insulation energy.

The solar cells 130 may be disposed in a shape, in which the solar cells are inserted into an interior of one side of the transparent substrate 110.

Here, the solar cells 130 may have a thin film shape with a thickness "T" and a width "W".

For example, thin film type solar cells having a thickness of 10 nm to 10 µm may be applied as the solar cells 130.

In detail, the kinds of the solar cells 130 applied in the present disclosure are not limited, but silicon thin film type solar cells and the like may be applied in the present disclosure.

Meanwhile, the silicon solar cells may be variously classified according to thin film deposition temperatures, kinds of substrates used, and deposition schemes, and may be largely classified into multi-crystalline and crystalline silicon solar cells.

A representative silicon solar cell is a crystal silicon solar cell (mono-crystalline and multi-crystalline), and representative structures that occupy the largest portion in the current solar cell market are a BSF structure and a PERC structure. Furthermore, a hybrid structure is manufactured to increase a conversion efficiency to that of the crystal silicon solar cells.

Meanwhile, an amorphous silicon solar cell (a-si) is not used as a substrate during manufacturing thereof, and may be classified into a thin film type solar cell and may be deposited on a transparent substrate when being manufactured.

The solar cells 130, to which the silicon solar cells having the above characteristics are applied, are inserted into or injection-molded in the transparent substrate 110 to have transparent characteristics.

In the present disclosure, the thin film solar cells 130 are installed in a horizontal arrangement that is perpendicular to a height direction of the transparent substrate 110, and are installed in a range, in which they are neither hindered by interferences of an incident angle of sunlight nor interfered in a range of a field of view of the user "U".

Meanwhile, the solar cells 130 may be constituted as a structure as in FIG. 5.

Referring to FIG. 6, the solar cell 130 includes a semiconductor substrate 131, an emitter part 132 that is located on a light-receiving surface of the semiconductor substrate 131, for example, a surface, to which light is input, a front surface electrode 134 that is located on the emitter part 132, a front surface electrode current collecting part (not illustrated) that is located on the emitter part 132 and crosses the front surface electrode 134, a passivation 133 that is located on a portion of the emitter part 132, at which neither the front surface electrode 134 nor the front surface electrode current collecting part (not illustrated) is located, and a back surface electrode 136 that is located on an opposite surface to the light-receiving surface, that is, a rear surface of the semiconductor substrate 131.

The solar cell 130 further includes a back surface field (BSF) part formed between the back surface electrode 136 and the semiconductor substrate 131. The back surface field part 135 is an area, in which impurities of the same conductive type as that of the semiconductor substrate 131 are doped at a concentration that is higher than that of the semiconductor substrate 131, for example, a p+ area, and is located inside the rear surface of the semiconductor substrate 131.

The back surface field part 135 is applied as an electric potential barrier. Accordingly, an efficiency of the solar cells 130 is enhanced as extinction of electrons and holes due to re-bonding thereof on a rear surface part of the semiconductor substrate 131 decreases.

The semiconductor substrate 131 is a semiconductor substrate formed of silicon of a first conductive type, for example, a p type conductive type. Then, the silicon may be mono-crystalline silicon, multi-crystalline silicon, or amorphous silicon. When the semiconductor substrate 131 is of a p type conductive type, it contains impurities of a triadic element, such as boron (B), gallium (Ga), and indium (In).

Here, in the semiconductor substrate 131, after the hollows "S" are formed through separate masks, the other configurations may be laminated.

A surface of the semiconductor substrate 131 may be a textured surface having a plurality of convexo-concave portions.

When the surface of the semiconductor substrate 131 is a textured surface, a light reflectance decreases on the light receiving surface of the semiconductor substrate 131 and an input and reflection operation is performed on the textured surface, whereby a light absorption rate increases because the light is confined within the solar cells.

Accordingly, an efficiency of the solar cells is improved. In addition, a reflection loss of the light that is input to the semiconductor substrate 131 is reduced, and an amount of the light that is input to the semiconductor substrate 131 further increases.

The emitter part 132 is an area, in which impurities of a second conductive type that is opposite to the conductive type of the semiconductor substrate 131, for example, an n type conductive type are provided, and forms a p-n junction with the semiconductor substrate 131.

When the emitter part 132 is of an n type conductive type, the emitter part 132 may be formed by doping pentad impurities, such as phosphor (P), arsenic (As), and antimony (Sb), on the semiconductor substrate 131.

Accordingly, when electron energy in an interior of the semiconductor is applied to electrons and holes by the light input to the semiconductor substrate 131, the electrons flow toward the n type semiconductor and the holes flow toward the p type semiconductor. Accordingly, when the semiconductor substrate 131 is of a p type and the emitter part 132 is of an n type, the separated holes flow toward the semiconductor substrate 131 and the separated electrons flow toward the emitter part 132.

In contrast, the semiconductor substrate 131 may be of an n type conductive type, and may be formed of the other semiconductor materials than the silicon. When the emitter part 132 is of an n type conductive type, the semiconductor substrate 131 may contain pentad impurities, such as phosphor (P), arsenic (As), and antimony (Sb).

Because the emitter part 132 forms a p-n junction with the semiconductor substrate 131, the emitter part 132 is of a p type conductive type when the semiconductor substrate 131 is of an n type conductive type. In this case, the separated electrons flow toward the semiconductor substrate 131, and the separated holes flow toward the emitter part 132.

When the emitter part 132 is of a p type conductive type, the emitter part 132 may be formed by doping triad impurities, such as boron (B), gallium (Ga), and indium (In), on the semiconductor substrate 131.

The passivation 133 including a silicon nitride film (SiNx), a silicon oxide film ($SiO_2$), or titan dioxide ($TiO_2$) may be formed on the emitter part 132 of the semiconductor substrate 131.

The front surface electrode 134 is formed on the emitter part 132 to be electrically and physically connected to the emitter part 132, and is formed on any one direction while being spaced apart from the adjacent front surface electrode 134. Each of the front surface electrodes 134 collects electric charges that flow toward the emitter part 132, for example, electrons.

The front surface electrode 134 may be formed of at least one conductive material, and the conductive material may be at least one selected from a group consisting of nickel (Ni), copper (Cu), silver (Ag), aluminum (Al), tin (Sn), zinc (Zn), indium (In), titanium (Ti), gold (Au), and a combination thereof, but may be formed of the other conductive metallic materials.

For example, the front surface electrode 134 may include silver (Ag) paste containing lead (Pb). In this case, the front surface electrode 134 may be electrically connected to the emitter part 132 in a process of applying silver paste on the passivation 133 by using a screen printing process and firing the semiconductor substrate 131 at a temperature of about 750° C. to 800° C.

Then, the above-described electrical connection is made as the lead substance contained in the silver (Ag) paste etches the passivation 133 so that the silver particles contact the emitter part 132.

At least front surface electrode current-collecting parts (not illustrated) are formed on the emitter part 132 of the semiconductor substrate 131 in a direction that crosses the front surface electrode 134.

The front surface electrode current-collecting parts (not illustrated) may be formed of at least one conductive material, and are electrically and physically connected to the emitter part 132 and the front surface electrode 134. Accordingly, the front surface electrode current-collecting parts (not illustrated) output electrical charges received from the front surface electrode 134, for example, electrons to an external device.

The conductive metallic material that constitutes the front surface electrode current-collecting parts (not illustrated) may be at least one selected from a group consisting of nickel (Ni), copper (Cu), silver (Ag), aluminum (Al), tin (Sn), zinc (Zn), indium (In), titanium (Ti), gold (Au), and a combination thereof, but may be the other conductive metallic materials.

Like the front surface electrode 134, the front surface electrode current-collecting parts (not illustrated) may be electrically connected to the emitter part 132 through a punch-through operation in a process of applying the conductive metallic material onto the passivation 133, patterning the conductive metallic material, and firing the conductive metallic material.

The back surface electrode 136 may be formed on an opposite side to the light receiving surface of the semiconductor substrate 131, that is, a rear surface of the semiconductor substrate 131, and collects electric charges that flow toward the semiconductor substrate 131, for example, holes.

The back surface electrode 136 may include at least one conductive material. The conductive material may be at least one selected from a group consisting of nickel (Ni), copper (Cu), silver (Ag), aluminum (Al), tin (Sn), zinc (Zn), indium (In), titanium (Ti), gold (Au), and a combination thereof, but may be the other conductive materials.

Here, the entire rear surface of the semiconductor substrate 131 also includes the rear surface of the semiconductor substrate 131, except for a peripheral portion thereof.

Here, the solar cells 130 may be constituted as a structure including at least one hollow "S" that passes through the structure in a height direction (the X axis direction) thereof.

Here, the height direction (the X axis direction) in FIG. 6 is the same as the horizontal direction (the X axis direction) in FIG. 5.

Meanwhile, the single solar cell 130 may have one hollow "S", and as in FIG. 6, may have a plurality of hollows "S".

Meanwhile, the solar cell 130 may include an inner surface 130a disposed to face the hollow "S", and an outer surface 130b disposed in an opposite direction to the inner surface 130a.

Here, the hollow "S" may be a four-sided hollow, and accordingly, the inner surface 130a may have a four-sided shape having four sides. Furthermore, it is preferable that the outer surface 130b has a four-sided shape having four sides, as in the inner surface 130a.

Here, it is preferable that four corners of each of the inner surface 130a and the outer surface 130b, which are formed by four sides thereof form a right angle.

As described above, the solar cells 130 having the at least one hollow "S" may be laminated in the X axis direction, and may be arranged in parallel to the transparent substrate 110.

Here, the horizontal arrangement means that they are disposed to have a width, in which they are laminated in a widthwise direction (the X axis direction) that is perpendicular to the one surface 110a of the transparent substrate 110 in an upright state in the height direction (the Z axis direction).

Meanwhile, the perpendicular relationship in the first embodiment of the present disclosure may mean that an angle therebetween is an angle (for example, 80° to 100°) that is adjacent to a right angle.

However, a range of the angle that defines the perpendicular relationship is not limited in the present disclosure.

Furthermore, a visual ray, a near-infrared ray, an ultraviolet ray passes through the transparent substrate, in the hollows between the solar cells 130.

It is apparent that the light passes through the transparent substrate 110 whereby visibility is secured and the transmission property of the transparent substrate 110 is guaranteed because there is no interference due to a field of view through gaps between the inner surfaces of the solar cells 130.

Meanwhile, the solar cells 130 may be of a double-side light reception type as described above, but in the embodiment of the present disclosure, the solar cells 130 may have light receiving surfaces such that the light receiving surfaces face an upper side and have non-light receiving surfaces such that the non-light receiving surfaces face a lower side.

That is, the solar cells 130 may be installed in the transparent substrate 110 in a horizontal arrangement, and may collect the input sunlight "L" through the light receiving surfaces and change the sunlight through a photoelectric conversion.

The light-concentrating parts 140 may be disposed in a form of a plurality of nano particles in the hollows "S" of the solar cells 130, and may disperse the input sunlight "L" and condense the light toward the solar cells 130, and through this, may enhance photoelectric efficiency.

Luminescent solar concentrators (LSCs) may be applied as the light-concentrating parts 140.

Hereinafter, characteristics of the solar cells and the solar cell module 100 including the same according to the first embodiment of the present disclosure will be described with reference to FIGS. 7 to 10.

Figure 7A:
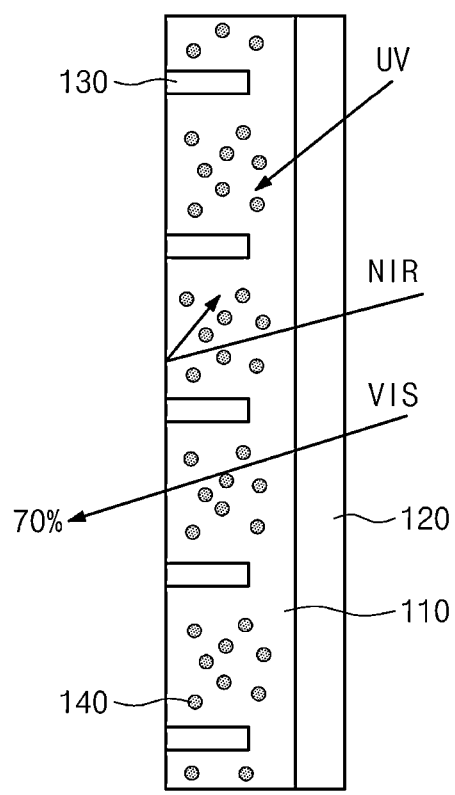
FIG. 7A is a diagram illustrating horizontal arrangement states of solar cells.
Figure 7B:
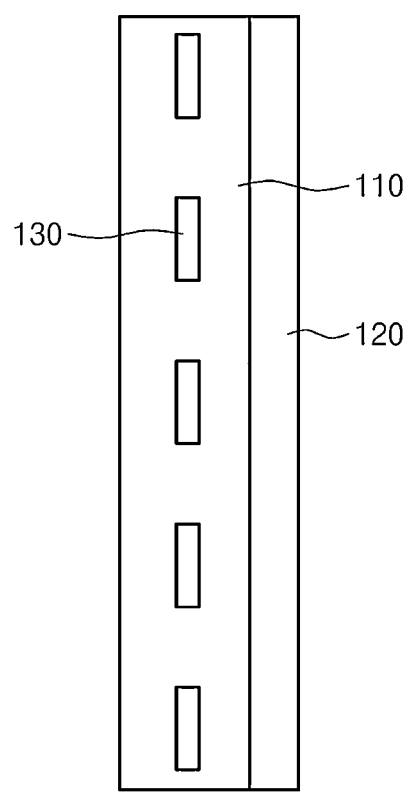
FIG. 7B is a diagram illustrating vertical arrangement states of solar cells.
Figure 9:
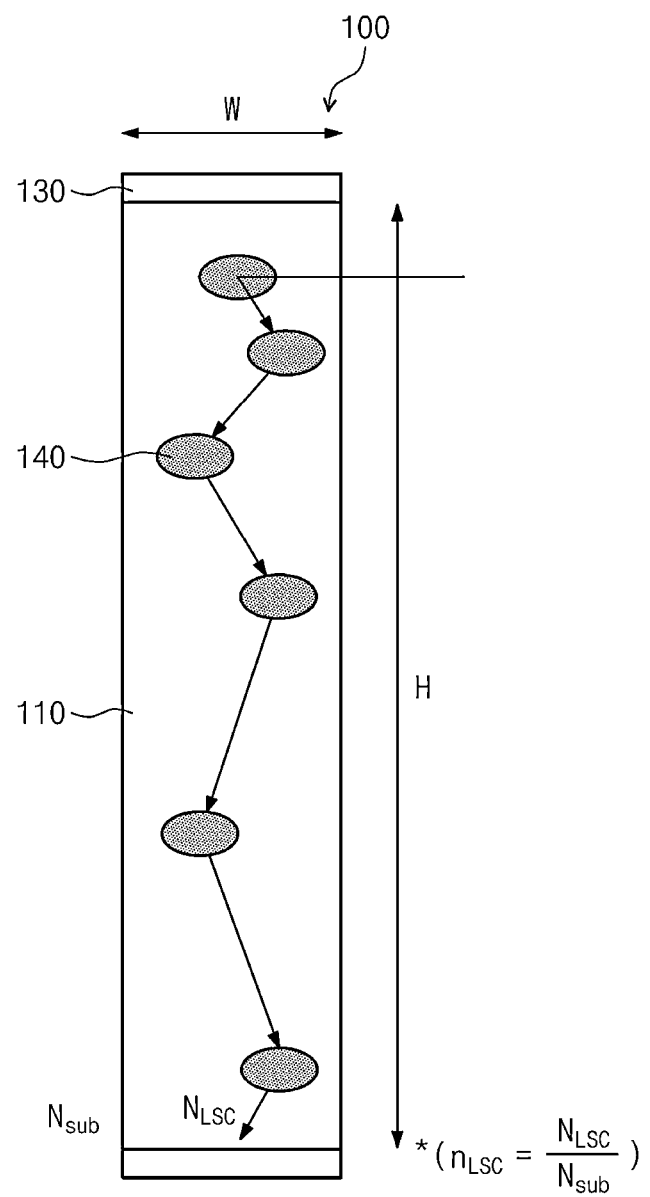
FIG. 9 is a diagram illustrating an arrangement state of solar cells and light-concentrating parts of a solar cell module of the present disclosure.
Figure 10:
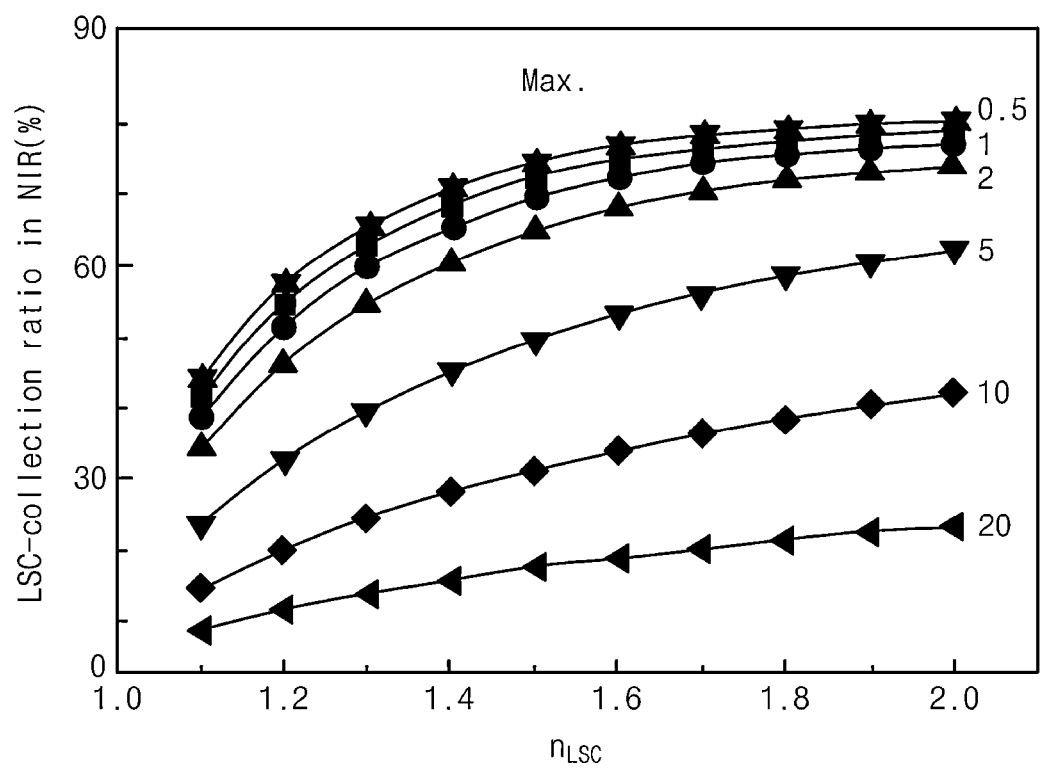
FIG. 10 is a graph depicting light-collection rates according to installation of solar cells and light-concentrating parts of a solar cell module of the present disclosure.

FIG. 7A is a diagram illustrating horizontal arrangement states of solar cells. FIG. 7B is a diagram illustrating vertical arrangement states of solar cells. 8A is a graph showing the transmittance varying according to the solar cell arrangement state of the solar cell module of the present disclosure. 8B is a graph showing the light collection rate that varies depending on the solar cell arrangement state of the solar cell module of the present disclosure. FIG. 9 is a diagram illustrating an arrangement state of the solar cells and the light-concentrating parts of the solar cell module of the present disclosure. FIG. 10 is a graph depicting light-collection rates according to installation of the solar cells and the light-concentrating parts of the solar cell module of the present disclosure.

Figure 8A:
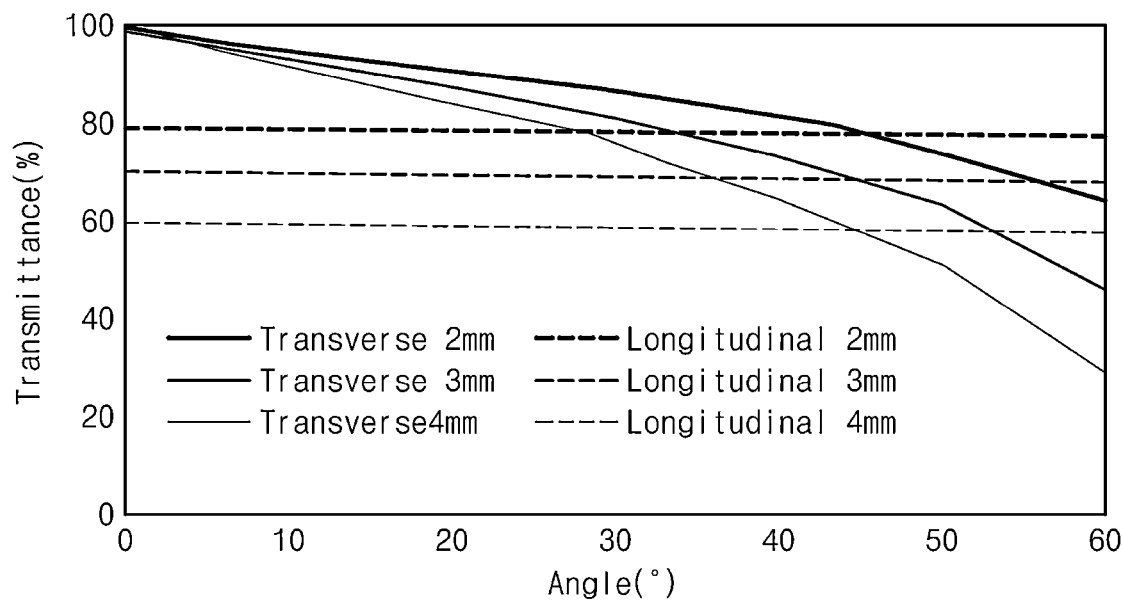
FIG. 8A is a graph showing the transmittance varying according to the solar cell arrangement state of the solar cell module of the present disclosure. 8B is a graph showing the light collection rate that varies depending on the solar cell arrangement state of the solar cell module of the present disclosure.
Figure 8B:
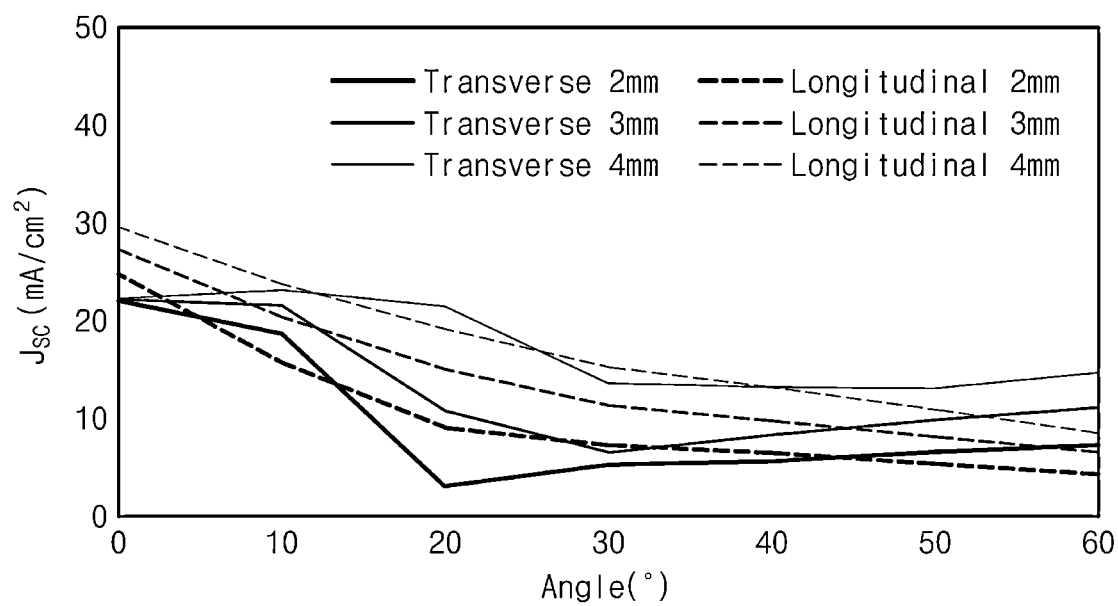

Referring to FIGS. 7 and 8, as in Table 1 as follows, it can be seen that light-concentration rates vary according to the vertical arrangement or the horizontal arrangement of the solar cells 130.

TABLE 1

| Incident angle of 0 degrees | Trans-verse 2 mm | Trans-verse 3 mm | Trans-verse 4 mm | Longi-tudinal 2 mm | Longi-tudinal 3 mm | Longi-tudinal 4 mm |
|---|---|---|---|---|---|---|
| Jsc (mA/cm$^2$) | 26.2 | 26.4 | 26.4 | 28.8 | 31.3 | 33.5 |
| Light-concentration rates | 3.6 | 2.4 | 1.8 | 4 | 2.9 | 2.3 |

As in Table 1, it may be seen that the light-concentration rate increases when the longitudinal lengths of the solar cells 130 are much larger than the transverse lengths of the solar cells 130 and thus the light-concentration rate becomes higher in the horizontal arrangement than in the vertical arrangement.

As a result, it is preferable that the solar cells 130 are installed in the horizontal arrangement scheme in the present disclosure.

Meanwhile, the solar cells are arranged vertically in a general solar cell module and the solar cell module is manufactured such that the solar cells are completely adhered to each other within a confined structure to increase an amount of electric power generated per unit area, but gaps are given between the solar cells to secure a view of sight so that the solar cells may be manufactured in a vertical arrangement as in the right side of FIG. 7.

Furthermore, as illustrated in FIGS. 9 and 10, it may be seen that light collection rates become lower by 20% due to losses related to scattering of the sunlight, reemission of light, and reabsorption of light as the gaps between the solar cells 130 become larger (as the size of the hollows becomes larger).

As a result, the plurality of light-concentrating parts 140 may be installed between the solar cells 130 to enhance the light collection rate.

Hereinafter, a solar cell, and a solar cell module including the same according to another embodiment of the present disclosure will be described with reference to FIGS. 11 to 19.

Meanwhile, in a description of the solar cell and the solar cell module including the same according to the another embodiment of the present disclosure, only different configurations from the configurations of the solar cell and the solar cell module including the same according to the prior embodiment will be described in detail, and a detailed description of the same configurations and the repeated reference numerals will be omitted.

Figure 11:
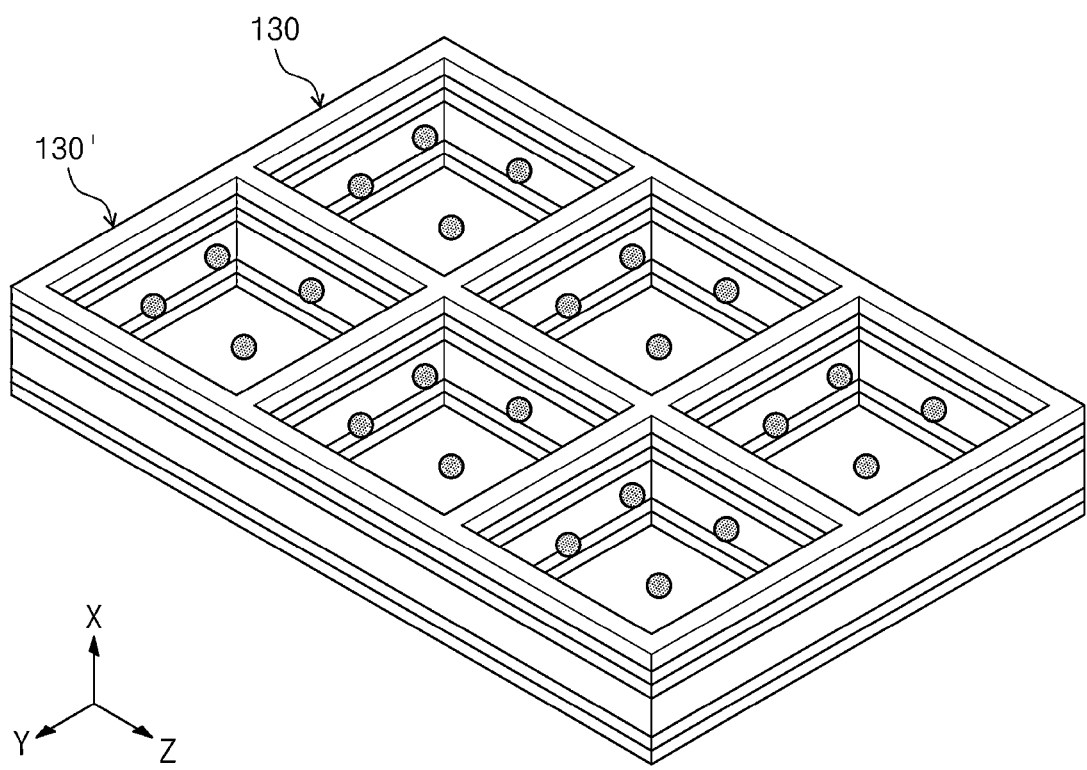
FIG. 11 is a diagram illustrating a solar cell module according to a second embodiment of the present disclosure.

FIG. 11 is a diagram illustrating a solar cell module according to a second embodiment of the present disclosure.

Referring to FIG. 11, in the solar cell module according to the second embodiment of the present disclosure, a plurality of solar cells 130 and 130' may be coupled to each other.

Here, an electric connection state of the adjacent solar cells 130 and 130' may be a parallel state.

Here, the semiconductor substrate 131, the emitter part 132, the front surface electrode 134, the passivation 133, the back surface field part 135, and the back surface electrode 136 of the first solar cell 130 may be coupled to the semiconductor substrate 131, the emitter part 132, the front surface electrode 134, the passivation 133, the back surface field part 135, and the back surface electrode 136 of the second solar cell 130', respectively.

Here, the adjacent solar cells 130 and 130' may be coupled to each other through a conductive adhesive.

Meanwhile, a direction, in which the plurality of solar cells 130 and 130' are adjacent to each other, may be at least one of the Z axis direction or the Y axis direction illustrated in FIG. 11.

Figure 12:
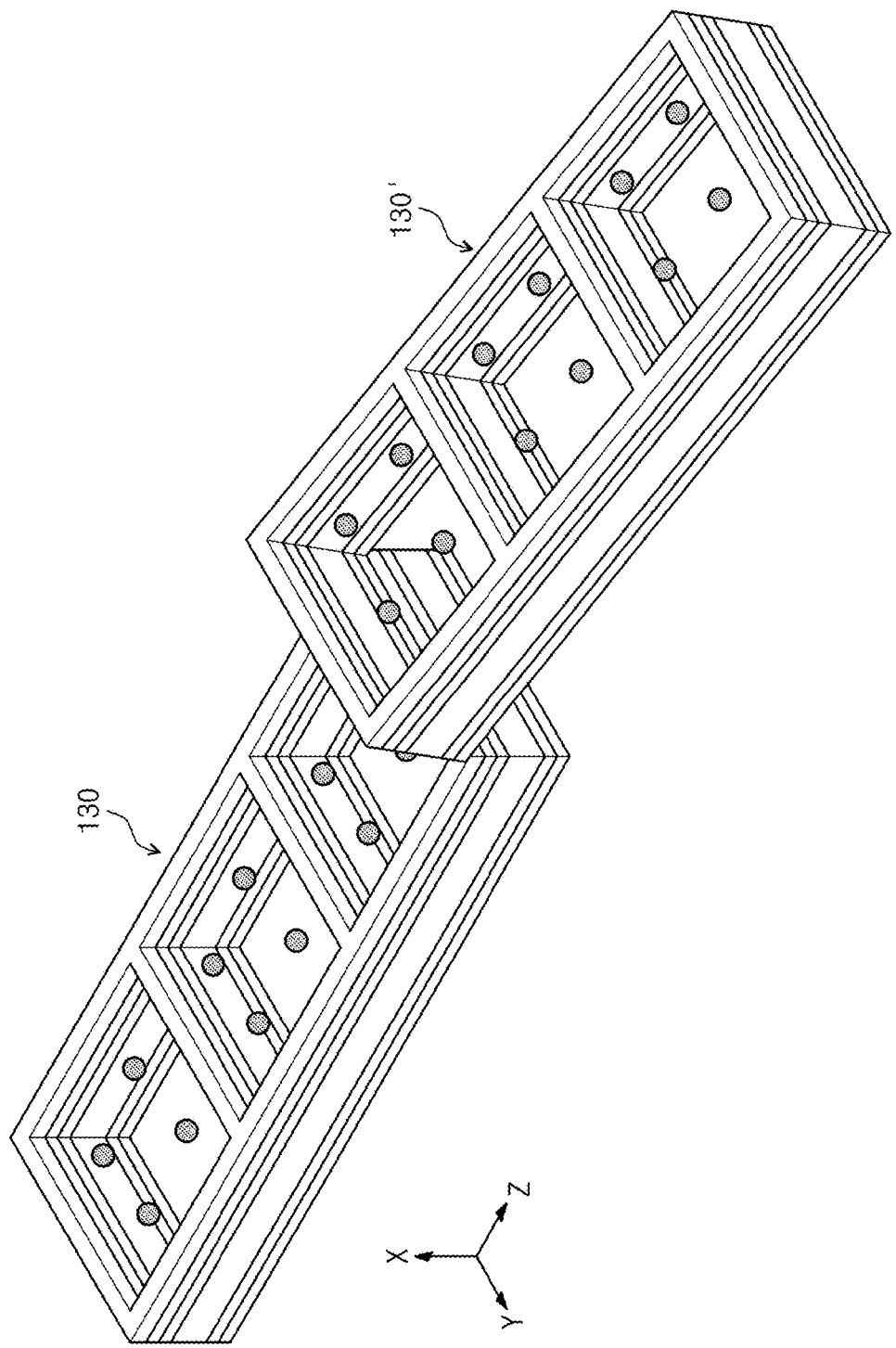
FIG. 12 is a diagram illustrating a solar cell module according to a third embodiment of the present disclosure.
Figure 13:
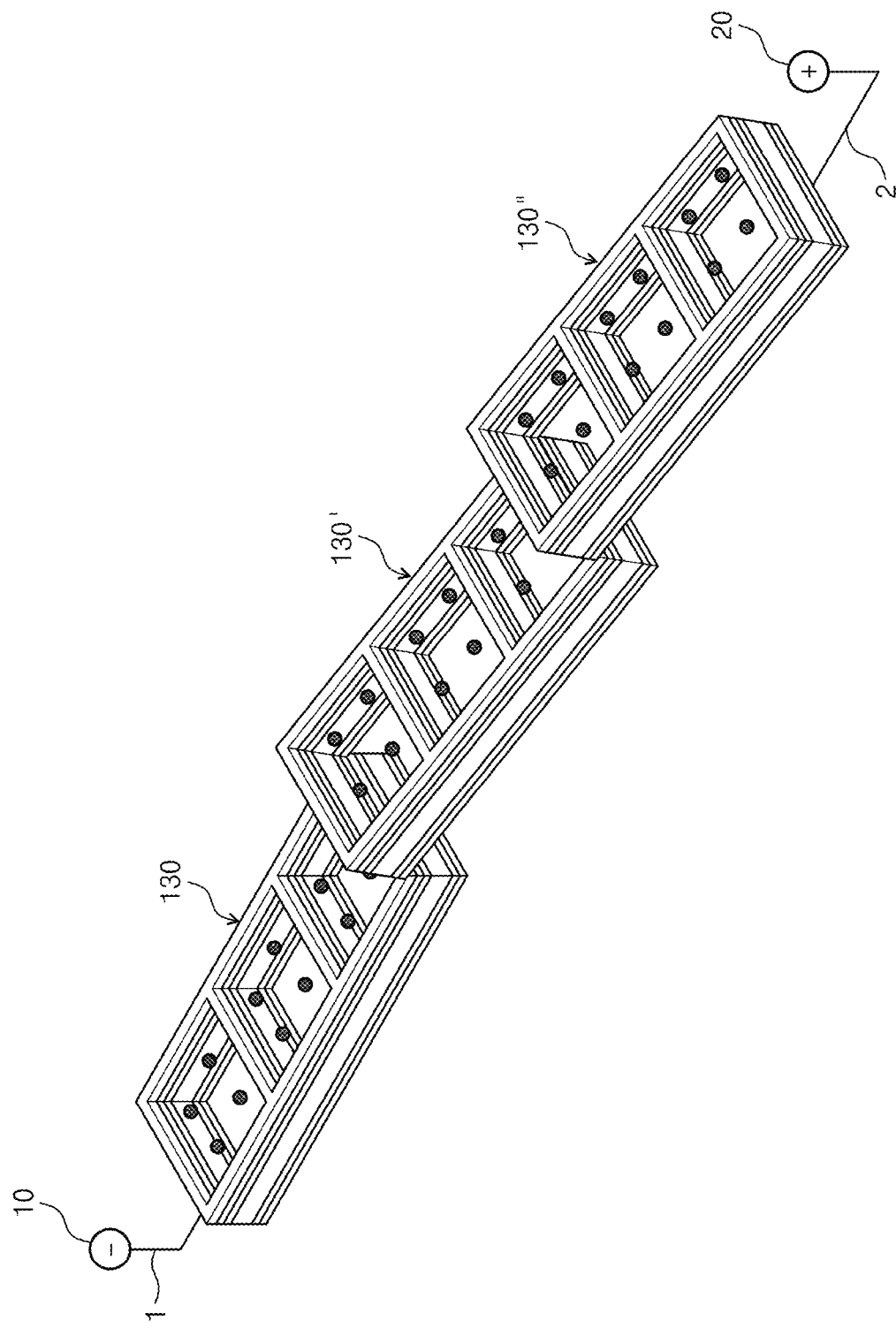
FIG. 13 is a diagram illustrating an electrical connection relationship of solar cell modules according to a second embodiment of the present disclosure.

FIG. 12 is a diagram illustrating a solar cell module according to a third embodiment of the present disclosure. FIG. 13 is a diagram illustrating an electrical connection relationship of the solar cell modules according to the third embodiment of the present disclosure.

Referring to FIGS. 12 and 13, in the solar cell module according to the third embodiment of the present disclosure, a plurality of solar cells 130, 130', and 130" that are adjacent to each other may be coupled to each other.

Here, an electric connection state of the adjacent solar cells 130, 130', and 130" may be a serial state.

Here, an upper end of the first solar cell 130 and a lower end of the second solar cell 130' may be coupled to each other, and an upper end or the second solar cell 130' and a lower end of the third solar cell 130" may be coupled to each other.

That is, the front surface electrode 134 of the first solar cell 130 may be directly connected to the back surface electrode 136 of the second solar cell 130' electrically and physically. Furthermore, the front surface electrode 134 of the second solar cell 130' may be directly connected to the back surface electrode 136 of the third solar cell 130" electrically and physically.

Furthermore, the front surface electrode 134 of the first solar cell 130 may be electrically connected to the first terminal 10 through a conductive member 1, and the back surface electrode 136 of the third solar cell 130" may be electrically connected to the second terminal 20 through a conductive member 2.

Through this, the solar cell module, in which the plurality of solar cells 130, 130', and 130" are connected to each other, may be constituted.

Figure 14:
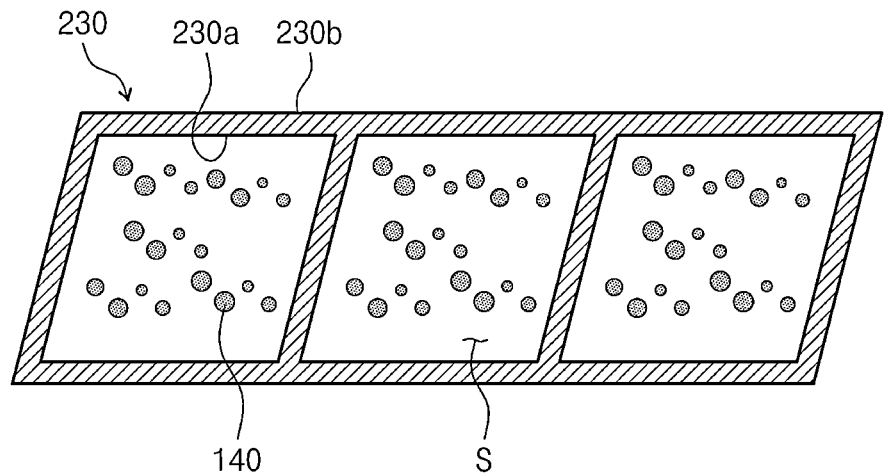
FIG. 14 is a diagram illustrating a solar cell module according to a fourth embodiment of the present disclosure.

FIG. 14 is a diagram illustrating a solar cell module according to a fourth embodiment of the present disclosure.

Referring to FIG. 14, an angle of a solar cell 230 according to the fourth embodiment of the present disclosure, which is defined by the inner surfaces of the hollows "S", is different from that of the solar cell 130 according to the first embodiment.

That is, four angles of the solar cell 230 according to the fourth embodiment, which defines the hollows "S", may not be a right angle, but may be an astute angle or an obtuse angle not to be constricted by an installation environment.

Figure 15:
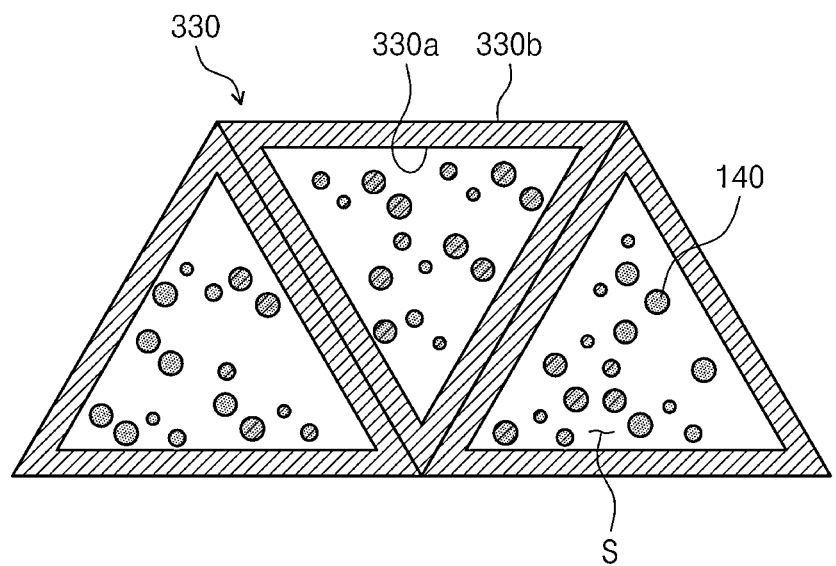
FIG. 15 is a diagram illustrating a solar cell module according to a fifth embodiment of the present disclosure.
Figure 16:
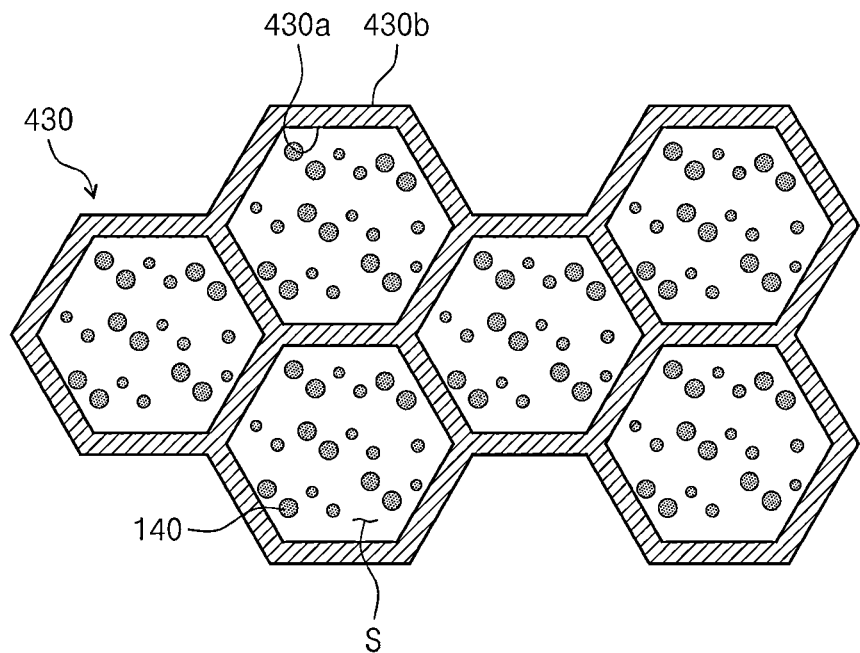
FIG. 16 is a diagram illustrating a solar cell module according to a sixth embodiment of the present disclosure.

FIG. 15 is a diagram illustrating a solar cell module according to a fifth embodiment of the present disclosure. FIG. 16 is a diagram illustrating a solar cell module according to a sixth embodiment of the present disclosure.

Referring to FIGS. 15 and 16, a solar cell 330 according to the fifth embodiment of the present disclosure and a solar cell 430 according to the sixth embodiment are different from the solar cell 130 according to the first embodiment in solar cell structures thereof.

The solar cell 330 according to the fifth embodiment has a triangular hollow "S", and thus an inner surface 330a and an outer surface 330b may have a triangular structure having three angles and three sides.

Furthermore, the solar cell 430 according to the sixth embodiment has a hexagonal hollow "S", and thus an inner surface 430a and an outer surface 430b may have a hexagonal structure having six angles and six sides.

That is, the hollows "S" of the solar cell 330 according to the fifth embodiment and the solar cell 430 according to the sixth embodiment may be constituted not to be constricted by an installation environment.

Furthermore, through a change in the structure, a structural stability may be secured.

Of course, although not illustrated, the structures of the hollow "S", the inner surface, and the outer surface of the solar cell according to the present disclosure may be variously changed, and the present disclosure is not limited thereto.

Figure 17:
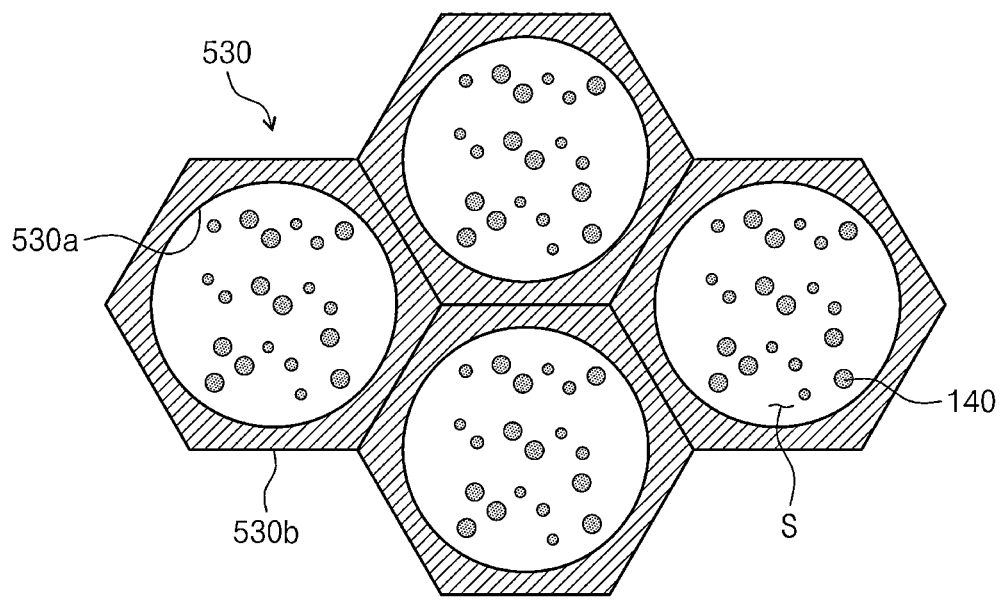
FIG. 17 is a diagram illustrating a solar cell module according to a seventh embodiment of the present disclosure.

FIG. 17 is a diagram illustrating a solar cell module according to a seventh embodiment of the present disclosure.

That is, shapes of cross-sections of an inner surface 530a and an outer surface 530b of a solar cell 530 according to the seventh embodiment may be different.

In a detailed example, the shapes of the cross-sections of the hollow "S" and the inner surface 530a may be circular, and the shape of the cross-section of the outer surface 530b may be hexagonal.

Here, it is preferable that the outer surface 530b of the solar cell 530 has a polygonal shape having sides and angles to restrain loss due to spacing spaces between the adjacent solar cells during coupling thereof and for a structural stability, and it is preferable that the hollow "S" and the inner surface 530a of the solar cell 530 is circular for input and reflection of light.

That is, the cross-sectional structures of the inner surface 530a and the outer surface 530b of the solar cell 530 according to the seventh embodiment are not constituted to be the same, and the structure of the solar cell may be constituted not to be constricted by an installation environment.

Accordingly, the solar cell 530 according to the seventh embodiment may secure a structural stability, and may maintain and enhance a photovoltaic efficiency.

Figure 18:
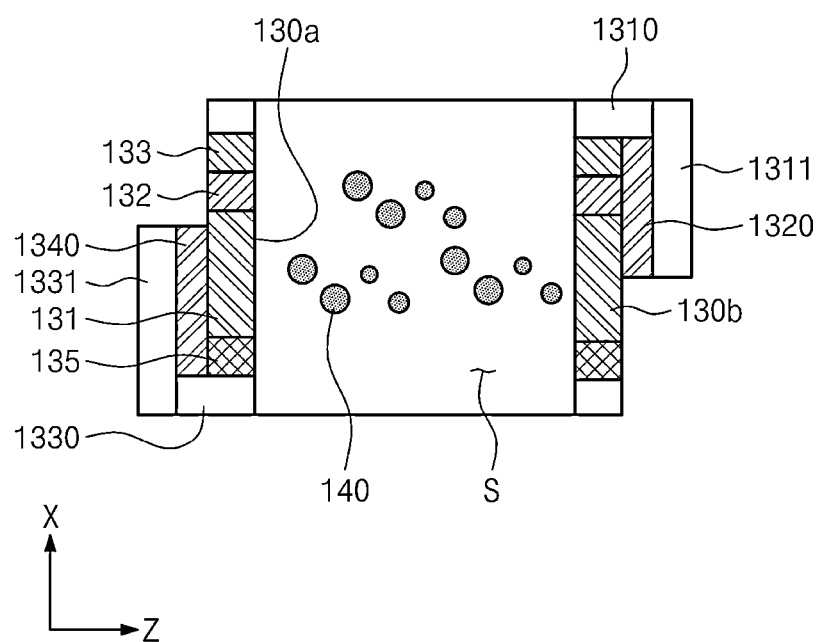
FIG. 18 is a diagram illustrating a solar cell module according to an eighth embodiment of the present disclosure.
Figure 19:
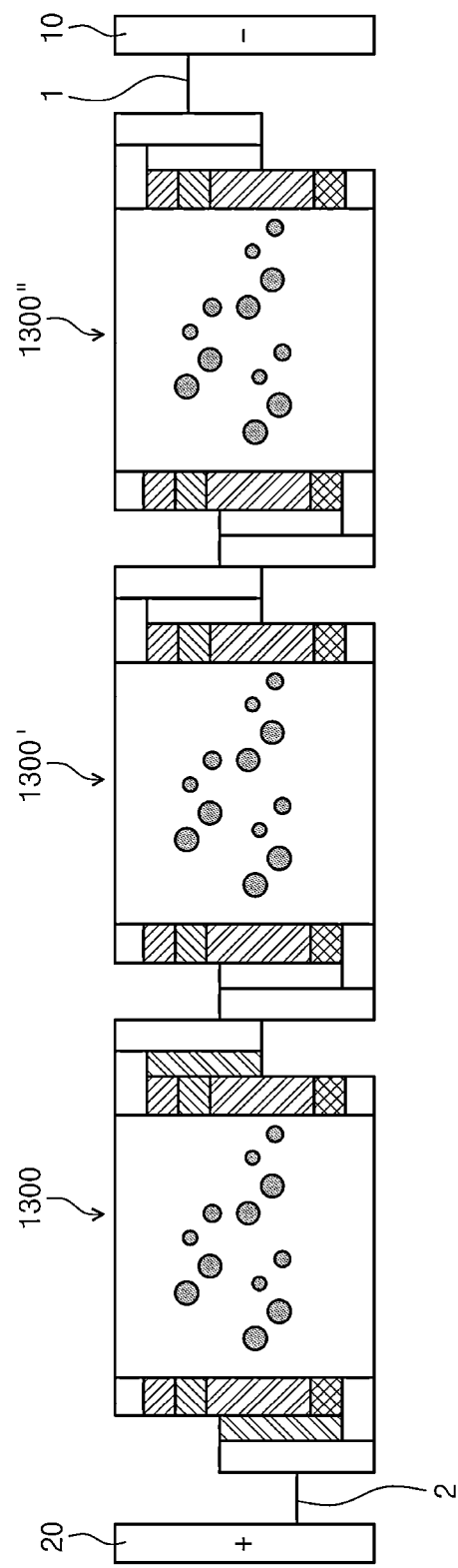
FIG. 19 is a diagram illustrating an electrical connection relationship of solar cell modules according to an eighth embodiment of the present disclosure.

FIG. 18 is a diagram illustrating a solar cell module according to an eighth embodiment of the present disclosure. FIG. 19 is a diagram illustrating an electrical connection relationship of solar cell modules according to an eighth embodiment of the present disclosure.

Referring to FIGS. 18 and 19, a solar cell 1300 according to the eighth embodiment of the present disclosure may include the semiconductor substrate 131, the emitter part 132, the passivation 133, the back surface field part 135, a front surface electrode 1310, and a back surface electrode 1330.

Furthermore, the front surface electrode 1310 may include a first protrusion 1311 that extends from the front surface electrode 1310 to one side and protrudes downwards, and the back surface electrode 1330 may include a second protrusion 1331 that extends from the back surface electrode 1330 to an opposite side and protrudes upwards.

Furthermore, a first insulation member 1320 for insulation may be disposed between the first protrusion 1311, the semiconductor substrate 131, the emitter part 132, and the passivation 133, and a second insulation member 1340 for insulation may be disposed between the second protrusion 1331, the semiconductor substrate 131, and the back surface field part 135.

Here, the first protrusion 1311 may cover all of surfaces of the semiconductor substrate 131, the emitter part 132, the passivation 133, and the back surface field part 135, and the second protrusion 1331 may cover all of opposite surfaces of the semiconductor substrate 131, the emitter part 132, the passivation 133, and the back surface field part 135.

Here, in the height direction (the X axis direction), the first protrusion 1311 and the second protrusion 1331 may have an overlapping area.

Referring to FIG. 19, the first protrusion 1311 of the first solar cell 1300 may be physically and electrically connected to the second protrusion 1331 of the second solar cell 1300', and the first protrusion 1311 of the second solar cell 1300' may be physically and electrically connected to the second protrusion 1331 of the third solar cell 1300'.

Furthermore, the first protrusion 1311 of the first solar cell 130 may be electrically connected to the first terminal 10 through the conductive member 1, and the second protrusion 1331 of the third solar cell 130" may be electrically connected to the second terminal 20 through the conductive member 2.

Through this, the plurality of adjacent solar cells 1300, 1300', and 1300" may be disposed on the same plane, and the solar cell modules including the same may be structurally stabilized.

The above detailed description exemplifies the present disclosure. Furthermore, the above-mentioned contents describe the exemplary embodiment of the present disclosure, and the present disclosure may be used in various other combinations, changes, and environments. That is, the present disclosure can be modified and corrected without departing from the scope of the present disclosure that is disclosed in the specification, the equivalent scope to the written disclosures, and/or the technical or knowledge range of those skilled in the art. The written embodiment describes the best state for implementing the technical spirit of the present disclosure, and various changes required in the detailed application fields and purposes of the present disclosure can be made. Accordingly, the detailed description of the present disclosure is not intended to restrict the present invention in the disclosed embodiment state. Furthermore, it should be construed that the attached claims include other embodiments.

DESCRIPTION OF REFERENCE NUMERALS

100: solar cell module
110: transparent substrate
120: glass layer
130, 230, 330, 430, 530, 1300: solar cells
140: light-concentrating part

The invention claimed is:
1. A solar cell module comprising:
a transparent substrate;
a solar cell structure disposed within one side of the transparent substrate, disposed perpendicularly to the one side surface of the transparent substrate and having at least one hollow that passes through the solar cell structure in a height direction thereof;
a plurality of light-concentrating parts disposed in each of the at least one hollow; and
a glass layer disposed on an opposite side surface to the one side surface of the transparent substrate and disposed spaced apart from the solar cell structure,
wherein the solar cell structure comprises:
a semiconductor substrate;
an emitter disposed on a light-receiving surface of the semiconductor substrate;

a passivation layer disposed on at least a portion of the emitter;

a front surface electrode disposed on the passivation layer;

a back surface field layer disposed on a surface opposite to the light-receiving surface of the semiconductor substrate;

a back surface electrode disposed on the back surface field layer;

a first protrusion extending from the front surface electrode in a first direction to the back surface field layer to cover the passivation layer and the emitter and to expose the back surface field layer;

a second protrusion extending from the back surface electrode in a second direction, which is opposite to the first direction, to the passivation layer to cover the back surface field layer and to expose the passivation layer and the emitter, wherein the solar cell structure comprises an inner surface facing the at least one hollow and an outer surface on an opposite side to the inner surface, and wherein the first protrusion covers a portion of the outer surface and exposes another portion of the outer surface, and the second protrusion covers a portion of the inner surface and exposes another portion of the inner surface.

2. The solar cell module of claim 1, wherein the plurality of light-concentrating parts comprise a plurality of nanoparticles.

3. The solar cell module of claim 1,
wherein a cross-section of the outer surface, which is perpendicular to the height direction, has a polygonal shape.

4. The solar cell module of claim 3, wherein a cross-section of the inner surface of the solar cell structure, which is perpendicular to the height direction, has a polygonal shape.

5. The solar cell module of claim 4, wherein, in the solar cell structure, the numbers of sides of the polygonal shapes formed by the inner surface and the outer surface are the same.

6. The solar cell module of claim 4, wherein, in the solar cell structure, the numbers of sides of the polygonal shapes formed by the inner surface and the outer surface are different.

7. The solar cell module of claim 3, wherein a cross-section of the inner surface of the solar cell structure, which is perpendicular to the height direction, has a circular or elliptical shape.

8. The solar cell module of claim 1, further comprising a first insulation layer disposed between the first protrusion; and the semiconductor substrate, the emitter, and the passivation layer.

9. The solar cell module of claim 1, further comprising a second insulation layer disposed between the second protrusion; and the semiconductor substrate and the passivation layer.

* * * * *